(12) United States Patent
Nakai et al.

(10) Patent No.: US 9,853,170 B2
(45) Date of Patent: Dec. 26, 2017

(54) SOLAR CELL MODULE MANUFACTURING METHOD

(71) Applicant: Panasonic Intellectual Property Management Co., Ltd., Osaka (JP)

(72) Inventors: Masaya Nakai, Shiga (JP); Yukihiro Yoshimine, Osaka (JP); Tomoki Narita, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 96 days.

(21) Appl. No.: 14/836,724

(22) Filed: Aug. 26, 2015

(65) Prior Publication Data
US 2015/0372156 A1  Dec. 24, 2015

Related U.S. Application Data

(63) Continuation of application No. PCT/JP2013/001165, filed on Feb. 27, 2013.

(51) Int. Cl.
*H01L 31/05* (2014.01)
*H01L 31/02* (2006.01)
*C09J 5/00* (2006.01)

(52) U.S. Cl.
CPC ............ *H01L 31/0201* (2013.01); *C09J 5/00* (2013.01); *H01L 31/0512* (2013.01); *Y02E 10/50* (2013.01); *Y10T 156/10* (2015.01)

(58) Field of Classification Search
CPC ............ H01L 31/0504; H01L 31/0508; H01L 31/05012
See application file for complete search history.

(56) References Cited

U.S. PATENT DOCUMENTS

| 4,515,297 A * | 5/1985 | Schoenthaler | B23K 3/06 222/160 |
| 4,803,124 A * | 2/1989 | Kunz | B23K 3/06 118/411 |
| 8,153,884 B2 * | 4/2012 | Tsunomura | H01L 31/0508 136/244 |
| 8,426,726 B2 | 4/2013 | Taira et al. | |

(Continued)

FOREIGN PATENT DOCUMENTS

| JP | 2006-270043 A | 10/2006 |
| JP | 2008-10857 A | 1/2008 |

(Continued)

OTHER PUBLICATIONS

International Search Report dated Mar. 26, 2013 issued in corresponding PCT/JP2013/001165 with English translation.

*Primary Examiner* — Jeff Aftergut
(74) *Attorney, Agent, or Firm* — McDermott Will & Emery LLP (57) ABSTRACT

A solar cell module manufacturing method includes: applying, when applying the adhesive in a narrow and long manner in a predetermined direction on a surface of the solar cell, the adhesive such that the thickness of the adhesive from the surface has a predetermined thickness at a central portion of the solar cell and such that the thickness from the surface becomes thinner gradually in a direction from the central portion of the solar cell toward an outer edge portion of the solar cell at an end portion of the solar cell.

7 Claims, 10 Drawing Sheets

(56) References Cited

U.S. PATENT DOCUMENTS

| | | |
|---|---|---|
| 2007/0235077 A1 | 10/2007 | Nagata et al. |
| 2009/0038675 A1 | 2/2009 | Tsunomura et al. |
| 2009/0078305 A1* | 3/2009 | Nishiwaki ....... H01L 31/022433 136/249 |
| 2013/0312826 A1 | 11/2013 | Narita et al. |

FOREIGN PATENT DOCUMENTS

| | | |
|---|---|---|
| JP | 2011-132295 A | 7/2011 |
| JP | 2012-204528 A | 10/2012 |
| JP | 2012-209349 A | 10/2012 |
| JP | 2012-253062 A | 12/2012 |
| JP | 2013-16531 A | 1/2013 |

\* cited by examiner

SOLAR CELL MODULE MANUFACTURING METHOD

CROSS REFERENCE TO RELATED APPLICATIONS

This Application is a Continuation Application of PCT/JP2013/001165 filed Feb. 27, 2013, the disclosure of which Application is incorporated by reference herein.

BACKGROUND

1. Field of the Invention

The present invention relates to a solar cell module manufacturing method.

2. Description of the Related Art

A solar cell module has a plurality of solar cells. The plurality of solar cells has electrodes on the respective surfaces thereof. The respective electrodes of the plurality of solar cells are connected to one another by connection members. The connection members are bonded by, for example, adhesives made of resins such that the connection members are connected conductively to the respective electrodes of the solar cells.

The solar cells have a thermal expansion coefficient that is different from that of the connection members. Therefore, when the temperature of the solar cell module changes due to an installation environment, stress is produced between the solar cells and the connection members. As a result, the connection members may peel off, and the solar cells may become damaged.

SUMMARY OF THE INVENTION

In this background, a purpose of the present invention is to provide a technology for improving the reliability of a solar cell module.

A solar cell module according to one embodiment of the present invention includes: a plurality of solar cells that each have a surface; a connection member that connects at least two of the plurality of solar cells; and a resin layer that bonds the connection member on the surface. The resin layer has, at an end portion of the solar cell, an inclined portion whose thickness from the surface becomes thinner gradually in a direction, which is a longitudinal direction of the connection member, from a central portion of the solar cell toward an outer edge portion of the solar cell.

Another embodiment of the present invention relates to a solar cell module manufacturing method. This method includes: preparing a plurality of solar cells, a connection member that extends in a single direction, and an adhesive that bonds the solar cell with the connection member; applying, when applying the adhesive in a narrow and long manner in a predetermined direction on a surface of the solar cell, the adhesive such that the thickness of the adhesive from the surface has a predetermined thickness at a central portion of the solar cell and such that the thickness from the surface becomes thinner gradually in a direction from the central portion of the solar cell toward an outer edge portion of the solar cell at an end portion of the solar cell; and bonding the connection member in an area on the surface of the solar cell in which the adhesive has been applied, such that a longitudinal direction of the connection member is aligned with the predetermined direction.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

The figures depict one or more implementations in accordance with the present teaching, by way of example only, not by way of limitations. In the figures, like reference numerals refer to the same or similar elements.

DETAILED DESCRIPTION OF THE INVENTION

The invention will now be described by reference to the preferred embodiments. This does not intend to limit the scope of the present invention, but to exemplify the invention.

Hereinafter, an example embodiment for carrying out the present invention will be described in detail with reference to the accompanying drawing. In the explanation of the figures, like numerals represent like constituting elements, and duplicative explanations will be omitted appropriately.

Figure 1:
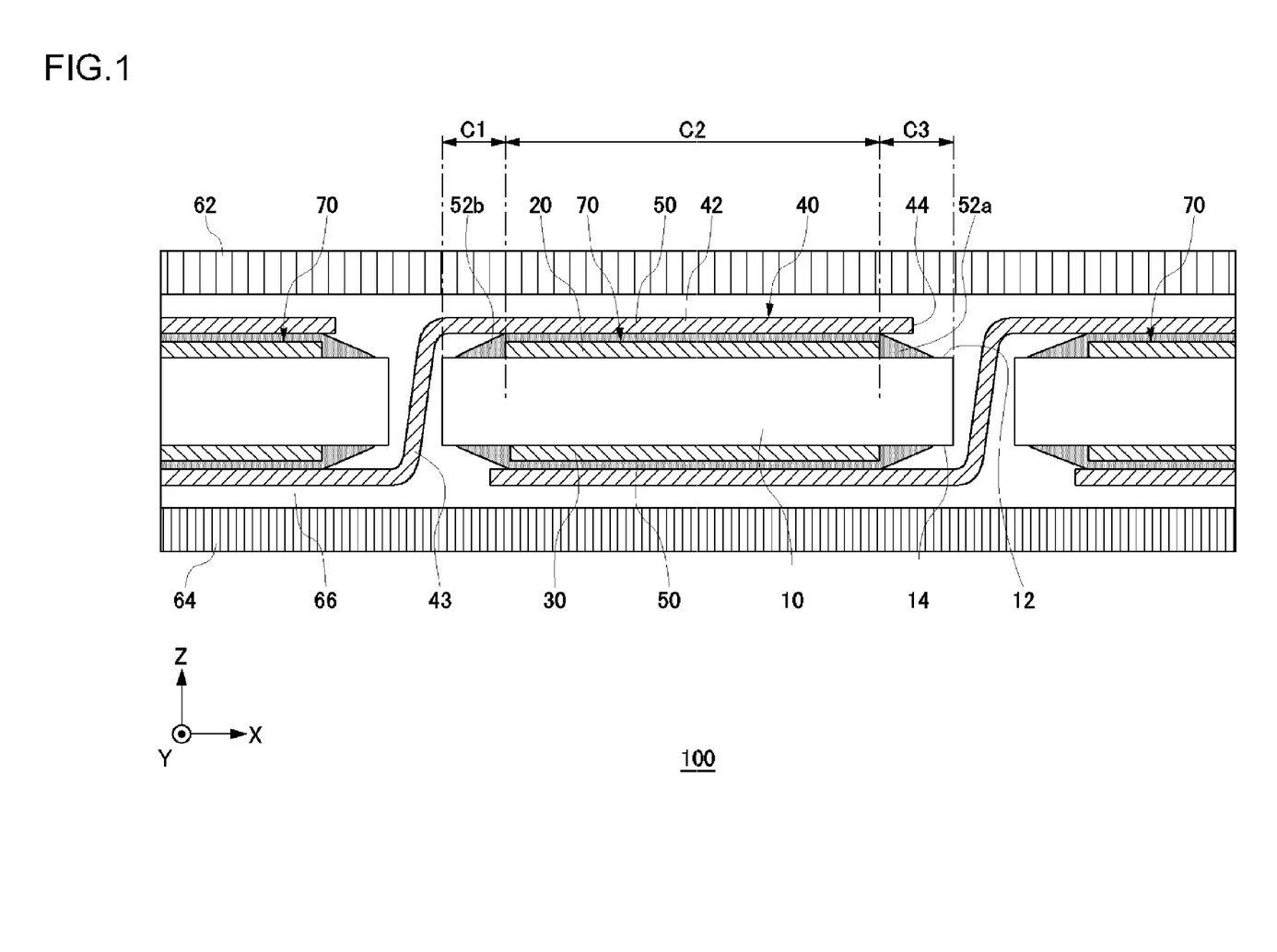
FIG. 1 is a cross-sectional view illustrating a solar cell module.

First, the configuration of a solar cell module 100 according to a first embodiment will be described in detail with reference to FIG. 1. FIG. 1 is a cross-sectional view illustrating the solar cell module 100 according to the first embodiment.

The solar cell module 100 according to the embodiment is provided with a plurality of solar cells 70, a connection member 40 connecting adjacent solar cells 70 with each other, a resin layer 50, a protection substrate 62, a back sheet 64, and a sealing layer 66. In the following, the respective configurations thereof will be described in detail in order.

The configuration of a solar cell 70 will be described first. The solar cell 70 is provided with an electricity generation layer 10, a first electrode 20, and a second electrode 30.

The electricity generation layer 10 is a layer that absorbs incident light so as to generate photovoltaic power and has a substrate made of a semiconductor material, for example, crystalline silicon, gallium arsenide (GaAs), indium phosphide (InP), or the like. The structure of the electricity generation layer 10 is not particularly limited. In the present embodiment, the electricity generation layer 10 has a heterojunction between an n-type monocrystalline silicon substrate and non-crystalline silicon. In the electricity generation layer 10, for example, an i-type non-crystalline silicon layer, a p-type non-crystalline silicon layer on which boron (B) or the like is doped, and a transparent conductive layer made of a translucent conductive oxide such as an indium oxide are layered in said order on the side of a light-receiving surface of the n-type monocrystalline silicon substrate. An i-type non-crystalline silicon layer, an n-type non-crystalline silicon layer on which phosphorous (P) or the like is doped, and a transparent conductive layer are layered in said order on the side of a back surface of the substrate.

The electricity generation layer 10 has a light-receiving surface 12, which is one surface of the solar cell 70, and a back surface 14, which is one surface of the solar cell 70 and is opposed to the light-receiving surface 12 at the back. The light-receiving surface means a principal surface on which sunlight mainly becomes incident in the solar cell 70 and, specifically, a surface on which the major portion of light that enters the electricity generation layer 10 becomes incident.

The first electrode 20 and the second electrode 30 are provided on the light-receiving surface 12 and the back surface 14, respectively, as electrodes provided on the surfaces of the solar cell 70 and take out electricity generated by the electricity generation layer 10 to the outside. The first electrode 20 and the second electrode 30 are conductive materials containing, for example, copper (Cu) or aluminum (Al). The first electrode 20 and the second electrode 30 may contain an electrolytic plating layer of copper (Cu), tin (Sn), or the like. However, the examples given are non-limiting. Other metals such as gold, silver, and the like, other conductive materials, or a combination of those may be used.

The configuration of the connection member 40 will be described in detail next. The connection member 40 is bonded by the resin layer 50 on a surface such that the connection member 40 is connected electrically and conductively to the first electrode 20 or the second electrode 30. The connection member 40 is an elongated metallic foil, and, for example, a copper foil coated with silver is used. The connection member 40 extends in an x direction in which the plurality of solar cells 70 are arranged and is connected to a first electrode 20 of one solar cell 70 that is adjacent in the x direction and to a second electrode 30 of the other solar cell 70.

The connection member 40 is provided with an extension portion 42, a bent portion 43, and a tip portion 44.

The extension portion 42 extends in the x direction along the light-receiving surface 12 or the back surface 14 and is boded to the light-receiving surface 12 or the back surface 14 via the resin layer 50. More specifically, the extension portion 42 is arranged on a bus bar electrode of the first electrode 20 or the second electrode 30 and bonded in a state where the extension portion 42 is directly in contact with at least a portion of the bus bar electrode such that the extension portion 42 becomes conductively connected to the bus bar electrode.

The tip portion 44 is provided inside or near an area of an end portion C1 or C3 of the solar cell 70.

The bent portion 43 has a step that corresponds to the thickness of the solar cell 70. The provision of the bent portion 43 allows the connection member 40 to connect a light-receiving surface 12 of one solar cell 70 to a back surface 14 of the other solar cell 70 while being in a state where the respective light-receiving surfaces 12 and the respective back surfaces 14 of the plurality of solar cells 70 are each arranged in the same plane.

The configuration of the protection substrate 62 will be described in detail next. The protection substrate 62 is provided on the side of the light-receiving surface 12 of the solar cell 70 and transmits light having a wavelength band that is absorbed by the solar cell 70 for the generation of electricity as well as protecting the solar cell 70 from the external environment. The protection substrate 62 is, for example, a glass substrate.

The configuration of the back sheet 64 and the configuration of the sealing layer 66 will be described in detail next. The back sheet 64 and the sealing layer 66 are resin materials such as ethylene-vinyl acetate copolymers (EVA), polyvinyl butyral (PVB), polyamides, or the like. This prevents, e.g., the infiltration of moisture to the solar cell 70 and also improves the overall strength of the solar cell module 100. The back sheet 64 may be a transparent substrate of glass as in the case of the protection substrate 62, plastic, or the like. Also, by providing a metallic foil or the like between the back sheet 64 and the sealing layer 66 so that a lot of light entering from the side of the protection substrate 62 is absorbed by the solar cell 70, light that reaches the back sheet 64 after passing through the solar cell 70 may be reflected to the solar cell 70.

Figure 2:
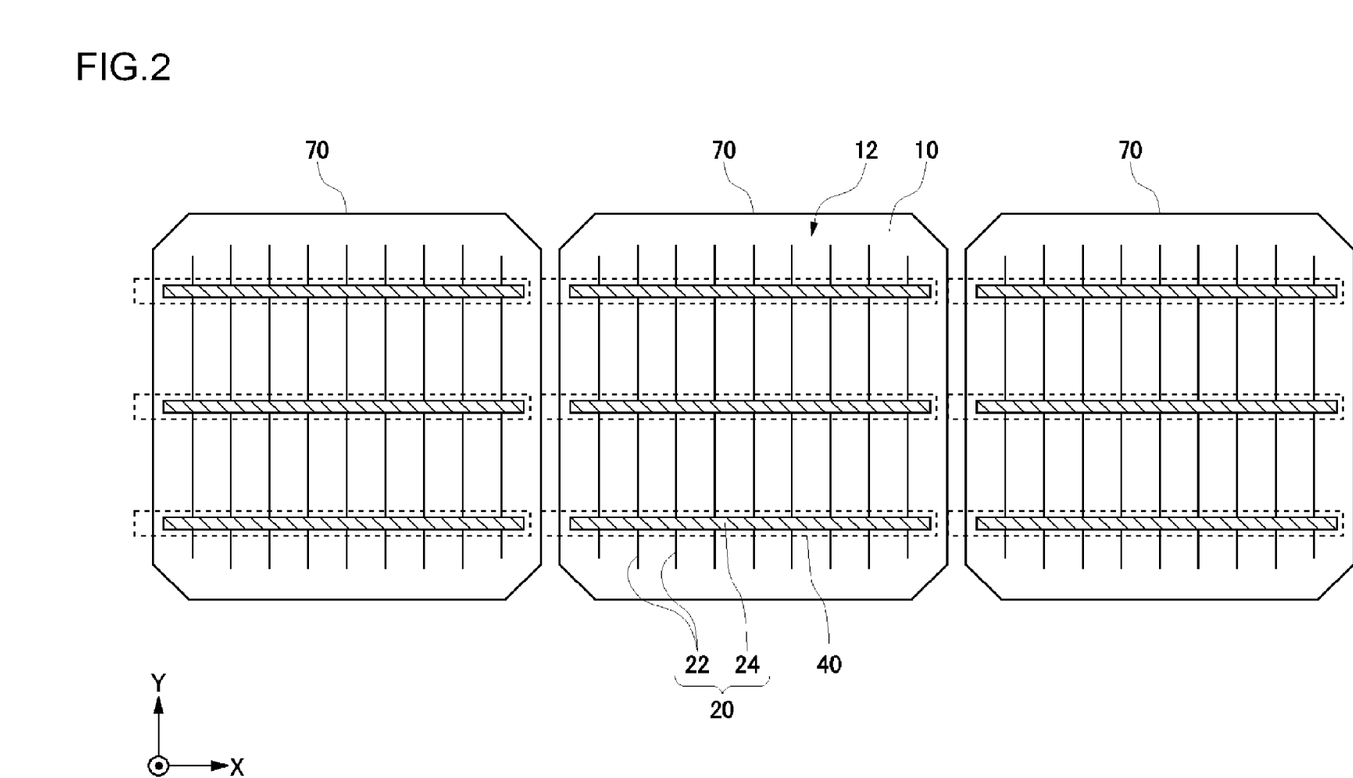
FIG. 2 is a plan view illustrating a surface of a solar cell.

The configuration of the first electrode 20 and the configuration of the second electrode 30 will be described in detail with reference to FIG. 2. FIG. 2 is a plan view illustrating a surface of the solar cell 70.

The first electrode 20 is provided with three bus bar electrodes 24 extending parallel to one another in a first direction (x direction) and a plurality of finger electrodes 22 extending perpendicularly to the bus bar electrodes 24 in a second direction (y direction). The finger electrodes 22 are formed on the light-receiving surface 12. Thus, the finger electrodes 22 are desirably formed thinly so that light entering the electricity generation layer 10 is not blocked. Also, the finger electrodes 22 are desirably arranged at a predetermined interval so as to be able to efficiently collect electricity that has been generated.

The bus bar electrodes 24 connect the plurality of finger electrodes 22 with one another. The bus bar electrodes 24 are desirably formed thin enough not to block light entering the electricity generation layer 10 and thick enough to allow the electricity collected from the plurality of finger electrodes 22 to flow efficiently.

In the same way as in the first electrode 20, the second electrode 30 is also provided with three bus bar electrodes extending parallel to one another in the x direction and a plurality of finger electrodes extending perpendicularly to the bus bar electrodes in the y direction. Since the back surface 14 is not a principle surface on which sunlight mainly becomes incident, the electricity collection efficiency may be increased by increasing the number of finger electrodes of the second electrode 30 than that of the first electrode 20 on the side of the light-receiving surface 12.

Figure 3:
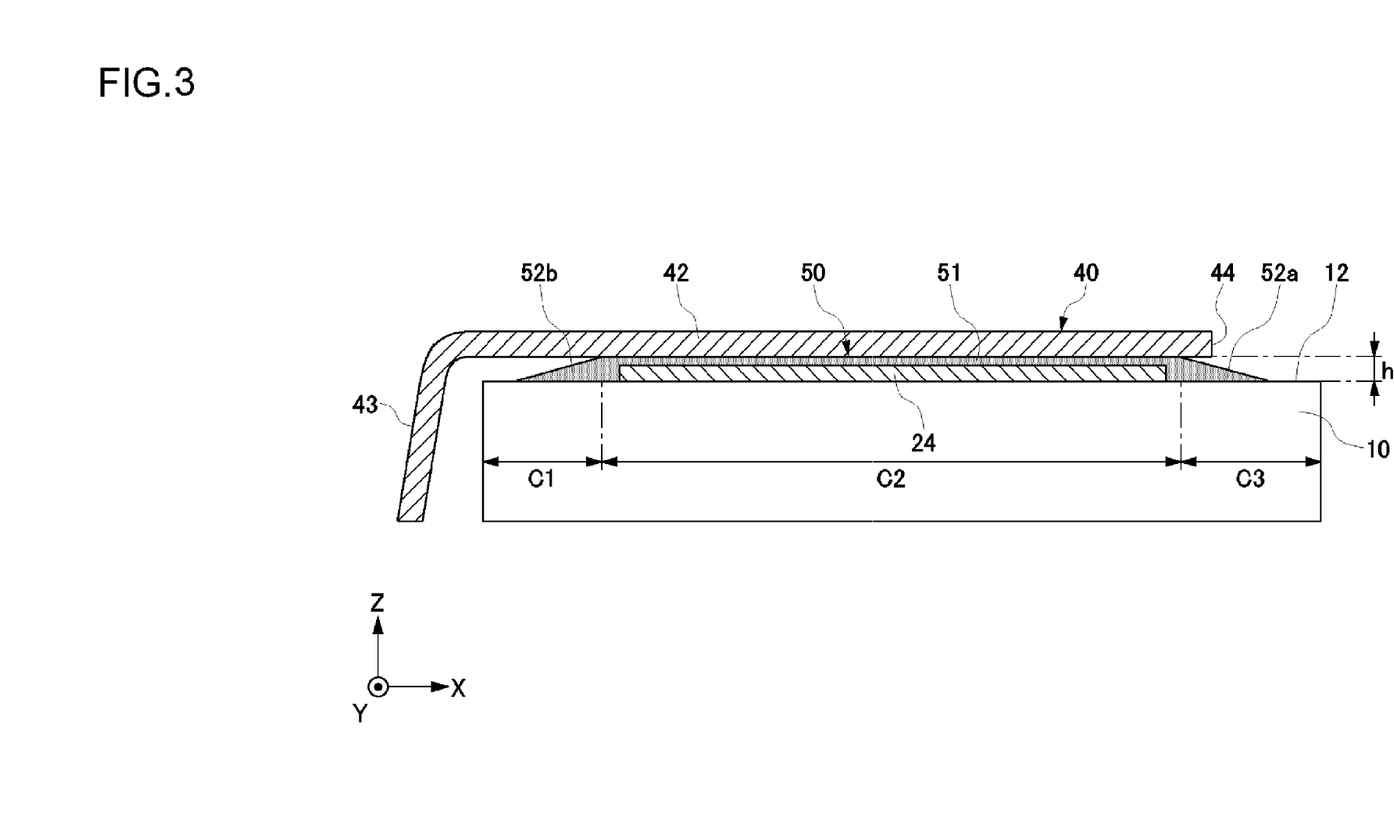
FIG. 3 is a cross-sectional view illustrating the structure of a resin layer.

The configuration of the resin layer 50 will be described in detail with reference to FIG. 3. FIG. 3 is a cross-sectional view illustrating the structure of the resin layer 50 and illustrates the resin layer 50 provided on the light-receiving surface 12.

The resin layer 50 is an adhesive layer in which a resin adhesive is hardened, and, for example, an adhesive thermosetting resin material such as an epoxy resin, an acrylic resin, a urethane resin, or the like is used. In the present embodiment, an insulating resin material is used as the resin layer 50. By dispersing conductive particles or the like in the resin material, the resin material may be designed to have conductivity.

The resin layer 50 is provided with a flat portion 51 and inclined portions 52a and 52b (hereinafter, generically referred to as inclined portions 52).

The flat portion 51 is provided in a narrow and long manner in the x direction along the bus bar electrodes 24 and is provided in an area of a central portion C2 of the solar cell 70 such that the thickness h from the light-receiving surface 12 becomes the thickness of the bus bar electrodes or larger. The flat portion 51 is at least in contact with a connection surface of the connection member 40 and bonds the connection member 40 to the light-receiving surface 12 while the connection member 40 is being in contact with the bus bar electrodes in a conductive manner.

The inclined portions 52 are provided in the respective areas of end portions C1 and C3 of the solar cell 70 while being in contact with the flat portion 51 and are provided to incline in such a manner that the thickness h from the light-receiving surface 12, which is the surface, becomes thinner gradually in a direction from the central portion toward the respective outer edge portions of the solar cell 70. Therefore, the inclined portions 52 have a role of increasing the bonding strength at the time of adhering the connection member 40 to the light-receiving surface 12 although the inclined portions 52 are not in contact with the connection member 40. Also, since the inclined portions 52 are provided to incline in such a manner that the thickness h from the surface becomes thinner gradually, an effect of relieving stress that is applied to the end portions C1 and C3 of the solar cell 70 can be improved.

The resin layer 50 provided on the light-receiving surface 12 is shown above using FIG. 3. A resin layer 50 is also provided on the back surface 14 just like the side of the light-receiving surface 12.

With reference to FIGS. 2 through 7, an explanation will be given now regarding an example of the manufacturing method of the solar cell module 100.

Figure 4:
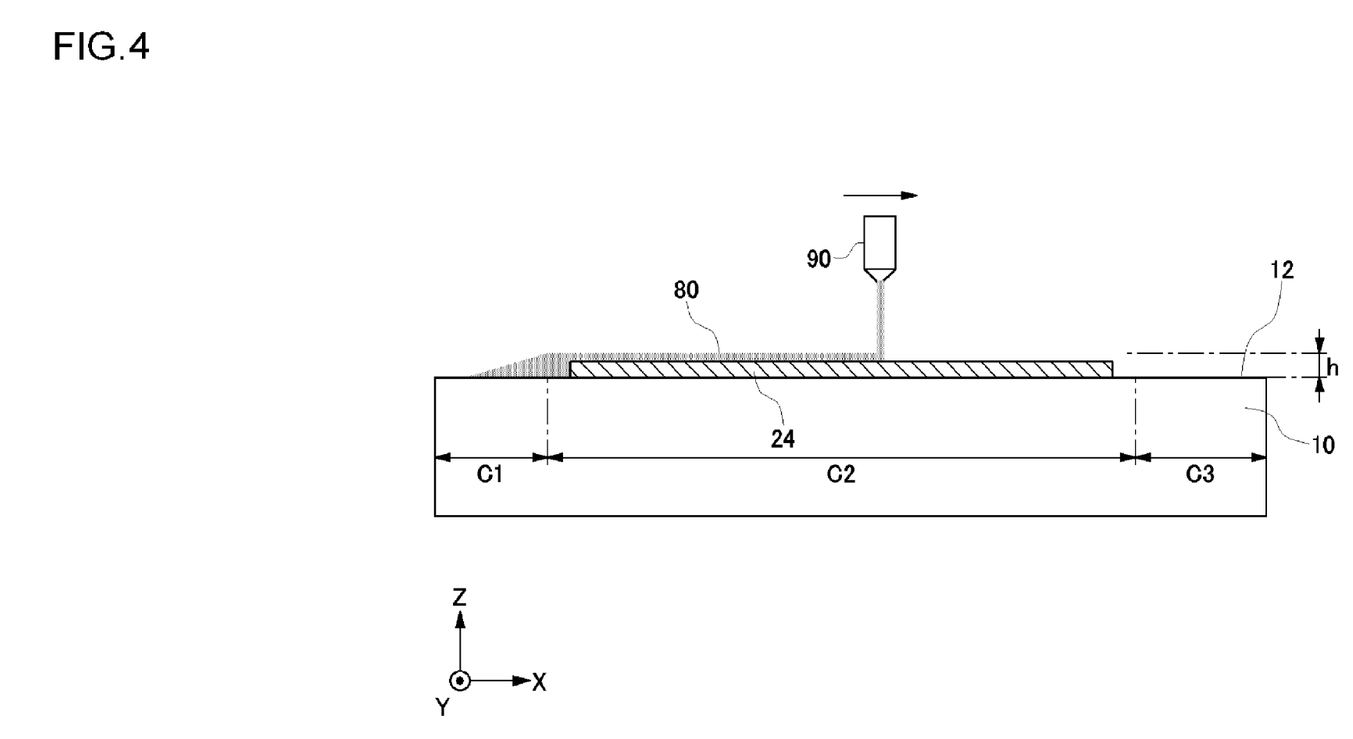
FIG. 4 is a diagram illustrating a process of applying an adhesive on a light-receiving surface of the solar cell.

FIG. 4 is a diagram illustrating a process of applying an adhesive 80 on the light-receiving surface 12 of the solar cell.

First, a plurality of solar cells 70 are prepared, and an adhesive 80 for bonding a connection member 40 is applied on a surface of a solar cell 70. The adhesive 80 is a paste-like resin adhesive having a thermosetting property and is, for example, a resin before hardening that is made into a paste by mixing a solid component into an epoxy resin to which a hardening agent is added.

The adhesive 80 is applied in a narrow and long manner in the x direction using a discharge means 90 such as a dispenser so as to cover the top of the bus bar electrodes 24. The adhesive 80 is applied such that the thickness thereof from the surface has a predetermined thickness h at the central portion C2 and applied such that the thickness h becomes thinner gradually in a direction from the central portion toward the respective outer edge portions of the solar cell 70 at the end portions C1 and C3. For example, by reducing the amount of the adhesive 80 that is applied to the end portions C1 and C3 and increasing the amount of the adhesive 80 that is applied to the central portion C2, the thickness h of the adhesive 80 can be controlled.

Figure 5A:
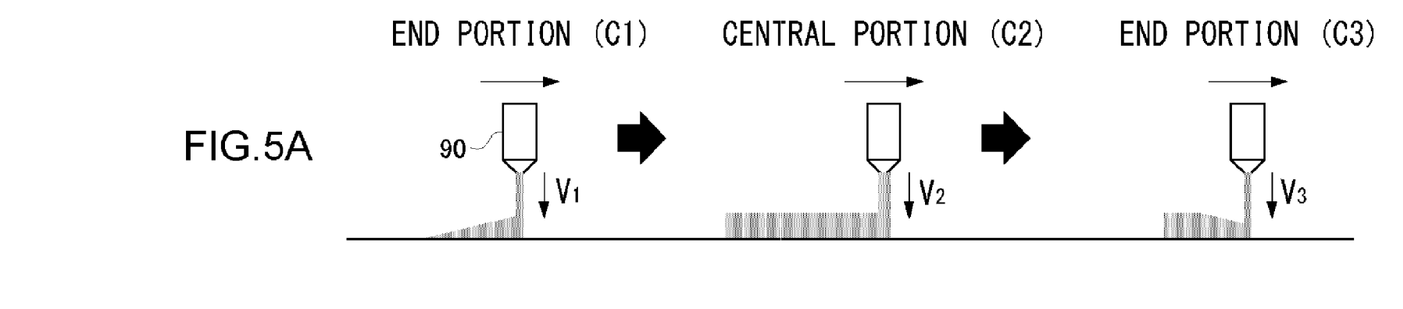
FIGS. 5A-5C are diagrams illustrating a method of applying the adhesive.
Figure 5B:
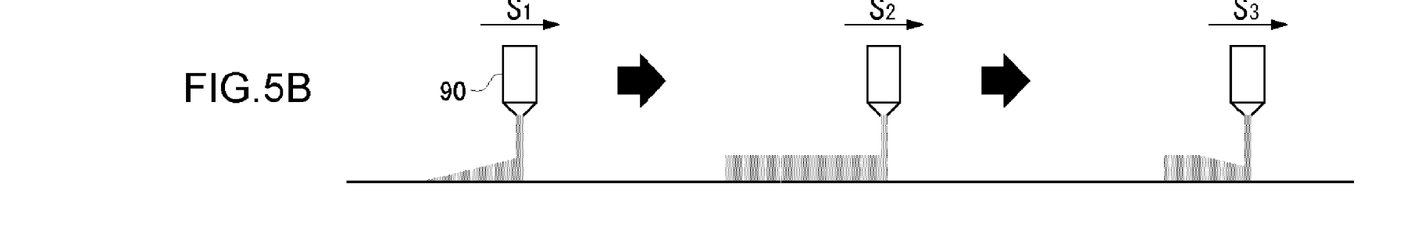
Figure 5C:
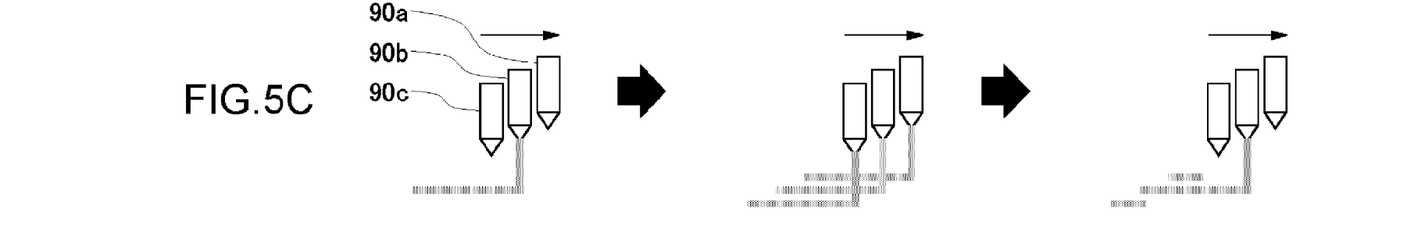

FIGS. 5A-5C are diagrams illustrating a method of applying the adhesive 80.

FIG. 5A illustrates a method of changing flow rates $v_1$ through $v_3$ of the adhesive 80 that is discharged from the discharge means 90 in the areas C1 through C3, respectively. By reducing the flow rates $v_1$ and $v_3$ of the adhesive 80 at the end portions C1 and C3, respectively, and increasing the flow rate $v_2$ of the adhesive 80 at the central portion C2 while keeping the speed of moving the discharge means 90 constant, the thickness of the adhesive 80 that is applied is controlled.

FIG. 5B illustrates a method of changing moving rates $s_1$ through $s_3$ of the discharge means 90 in the areas C1 through C3, respectively. By increasing the moving rates $s_1$ and $s_3$ of the moving the discharge means 90 at the end portions C1 and C3, respectively, and reducing the moving rate $s_2$ at the central portion C2 while keeping the flow rate of the adhesive 80 discharged from the discharge means 90 constant, the thickness of the adhesive 80 that is applied is controlled.

FIG. 5C illustrates a method of changing the number of discharge means 90a through 90c that discharge the adhesive 80 that in the areas C1 through C3. By applying an adhesive from only the central discharge means 90b among the three discharge means 90a through 90c at the end portions C1 and C3 and applying an adhesive from all the three discharge means 90a through 90c at the central portion C2, the thickness of the adhesive 80 that is applied is controlled.

The adhesive 80 may be applied by printing. For example, in the case of performing printing by intaglio offset printing, the thickness of the adhesive 80 that is printed can be controlled by reducing the depth of concave portions in the respective areas corresponding to end portions C1 and C3 and increasing the depth of a concave portion in the area corresponding to the central portion C2, in a printing plate. In addition, in the case of performing printing by screen printing, the amount of the adhesive 80 that is applied may be controlled by changing an interval between meshes of a printing plate.

Figure 6:
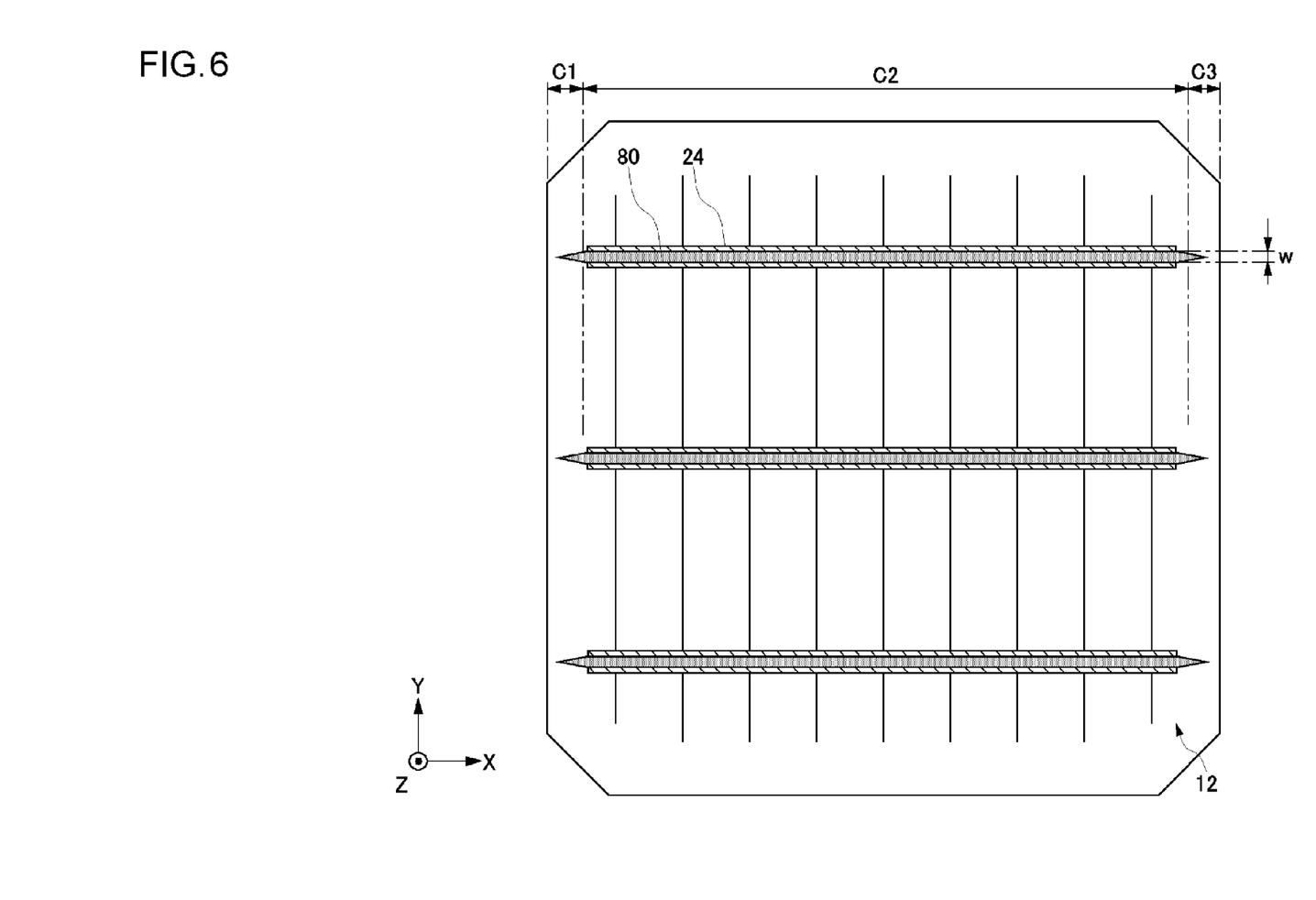
FIG. 6 is a diagram illustrating the adhesive applied on the light-receiving surface of the solar cell.

FIG. 6 is a diagram illustrating the adhesive 80 that is applied on the light-receiving surface 12 of the solar cell 70.

As described above, the adhesive 80 is applied in a narrow and long manner in the x direction in which the bus bar electrodes 24 extend. The adhesive 80 is applied such that the width w thereof in the y direction that is perpendicular to the x direction in which the adhesive 80 is applied becomes narrower in a direction from the central portion toward the respective outer edge portions of the solar cell 70 at the end portions C1 and C3.

Figure 7:
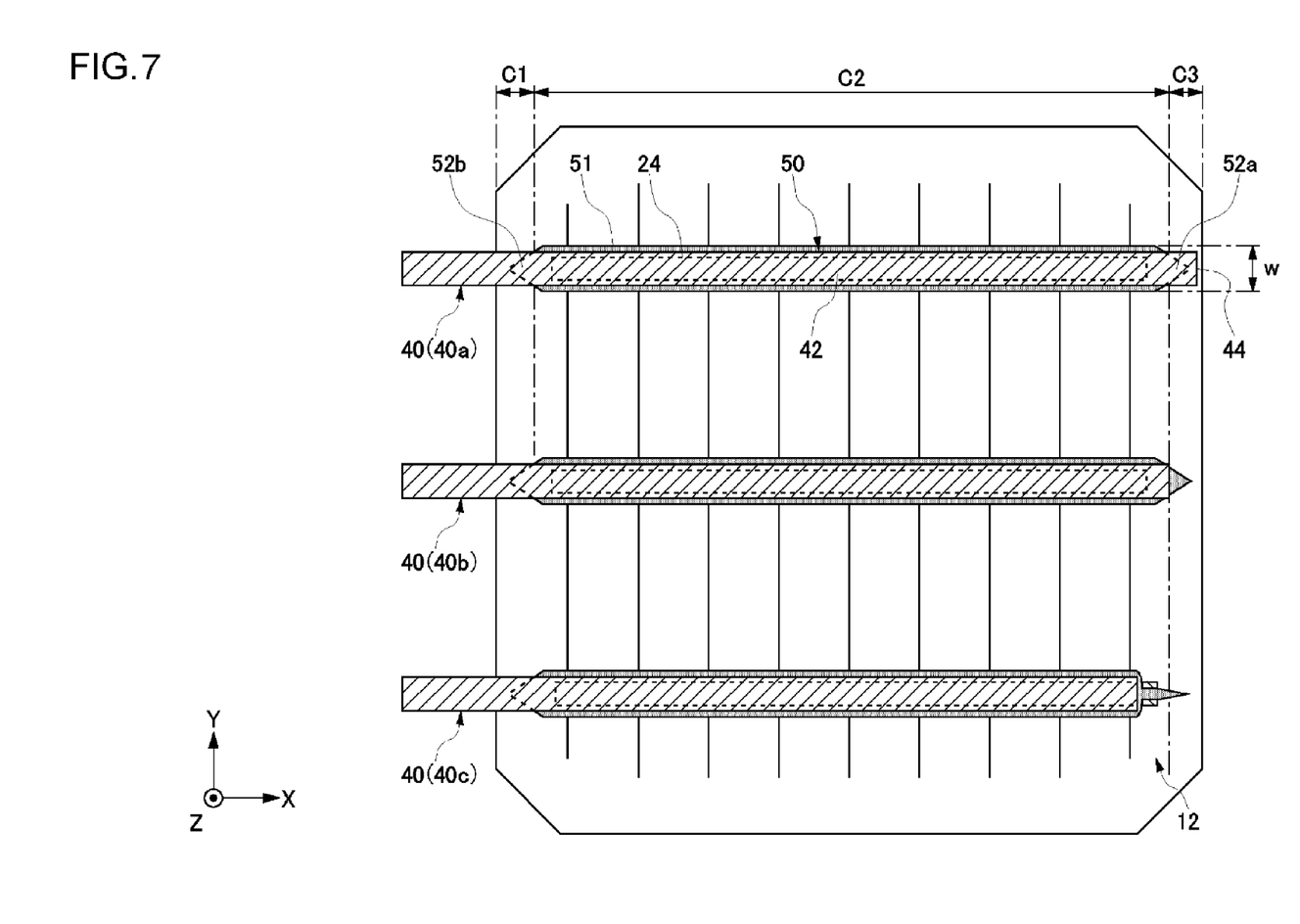
FIG. 7 is a diagram illustrating the solar cell to which a connection member is bonded.

A connection member 40 is then bonded to the solar cell 70. FIGS. 7A-7C are diagrams illustrating the solar cell 70 to which the connection member 40 is bonded.

In accordance with the adhesive 80 that is applied in the x direction on the light-receiving surface 12, the connection member 40 is arranged on the adhesive 80 such that the longitudinal direction is aligned with the x direction and is pressed such that a bus bar electrode 24 and the connection member 40 are directly in contact with each other and connected electrically and conductively. The pressing of the connection member 40 makes the adhesive 80 to overflow around the bus bar electrode 24, and the light-receiving surface 12 and the connection member 40 are bonded to each other by the adhesive 80 that has overflown. The thickness of the adhesive 80 applied to the end portions C1 and C3 is thinner compared to that applied to the central portion C2 at this time. Thus, the adhesive 80 applied to the end portions C1 and C3 is less likely to spread peripherally compared to the case of the central portion C2, when the adhesive 80 is pressed from above by the connection member 40.

By thermally hardening the adhesive 80 by heating the connection member 40 in this state, a resin layer 50 is formed that includes a flat portion 51 provided on the central portion C2 and inclined portions 52a and 52b provided on the end portions C1 and C3. The inclined portions 52a and 52b have a shape where the inclined portions 52a and 52b are inclined in such a manner that the thickness becomes thinner gradually in a direction from the central portion toward the respective outer edge portions. The inclined portions 52a and 52b are formed such that the width w thereof that is perpendicular to the longitudinal direction becomes narrower gradually in the direction from the central portion toward the respective outer edge portions of the solar cell 70.

As shown in FIG. 7, the connection members 40 (40a, 40b, and 40c) may be bonded while being shifted in the x direction within a certain range. The connection member 40a shows a case where the tip portion 44 is provided such that the position of the tip portion 44 is at the tip of the inclined portion 52a, and the extension portion 42 of the connection member 40 is arranged on the inclined portion 52a. The connection member 40b shows a case where the tip portion 44 is arranged on the inclined portion 52a, and the connection member 40c shows a case where the tip portion 44 is arranged on the flat portion 51. In either of the cases, stress produced between the connection member 40 and the solar cell 70 can be mitigated by the inclined portion 52a formed in the area of the end portion C1.

The connection member 40 is further bonded to a bus bar electrode of the second electrode 30 provided on the back surface 14. After the connection member 40 is bonded to the light-receiving surface 12, the connection member 40 can be boded to the back surface 14 via the resin layer 50 through the same processes as those shown in FIGS. 4-7.

The plurality of solar cells 70 to which the connection member 40 is connected is sealed at the end. A resin sheet that constitutes a portion of the sealing layer 66 and a protection substrate 62 are arranged on the light-receiving surface 12 side of the plurality of solar cells 70 to which the connection member 40 is connected, and a resin sheet that constitutes a portion of the sealing layer 66 and a back sheet 64 are arranged on the back surface 14 side. By thermo-compression-bonding the solar cell 70 while the solar cell 70 is sandwiched between the protection substrate 62 and the back sheet 64, the resin sheet on the light-receiving surface 12 side and the resin sheet on the back surface 14 side are fused so as to form the sealing layer 66, and a solar cell module 100 is thus formed.

An explanation will be given in the following regarding effects achieved by the solar cell module 100 according to the present embodiment.

In the solar cell module 100 according to the present embodiment, the inclined portions 52a and 52b are provided, as the resin layer 50 to which the connection member 40 is bonded, whose thickness becomes thinner gradually in a direction from the central portion toward the respective outer edge portions in the respective areas of the end portions C1 and C3. By providing the inclined portions 52a and 52b whose thickness becomes gradually thinner, the stress concentrating on the respective areas of the end portions C1 and C3 can be mitigated, thus preventing the connection member 40 from peeling off and the solar cell 70 from being damaged. Thus, the reliability of the solar cell module 100 can be increased.

Since the inclined portions 52 are formed such that the widths thereof in the y direction, which is perpendicular to the x direction in which the connection member 40 extends, become narrower in the direction from the central portion toward the respective outer edge portions, areas where light entering the end portions C1 and C3 is blocked can be reduced. Therefore, by providing the resin layer 50 on the end portions C1 and C3, the bonding strength can be increased, and a decrease in the efficiency in electricity generation caused due to the provision of the resin layer 50 can be suppressed.

The configuration of a solar cell module 200 according to a second embodiment will be described in detail with reference to FIGS. 8 and 9.

Figure 8:
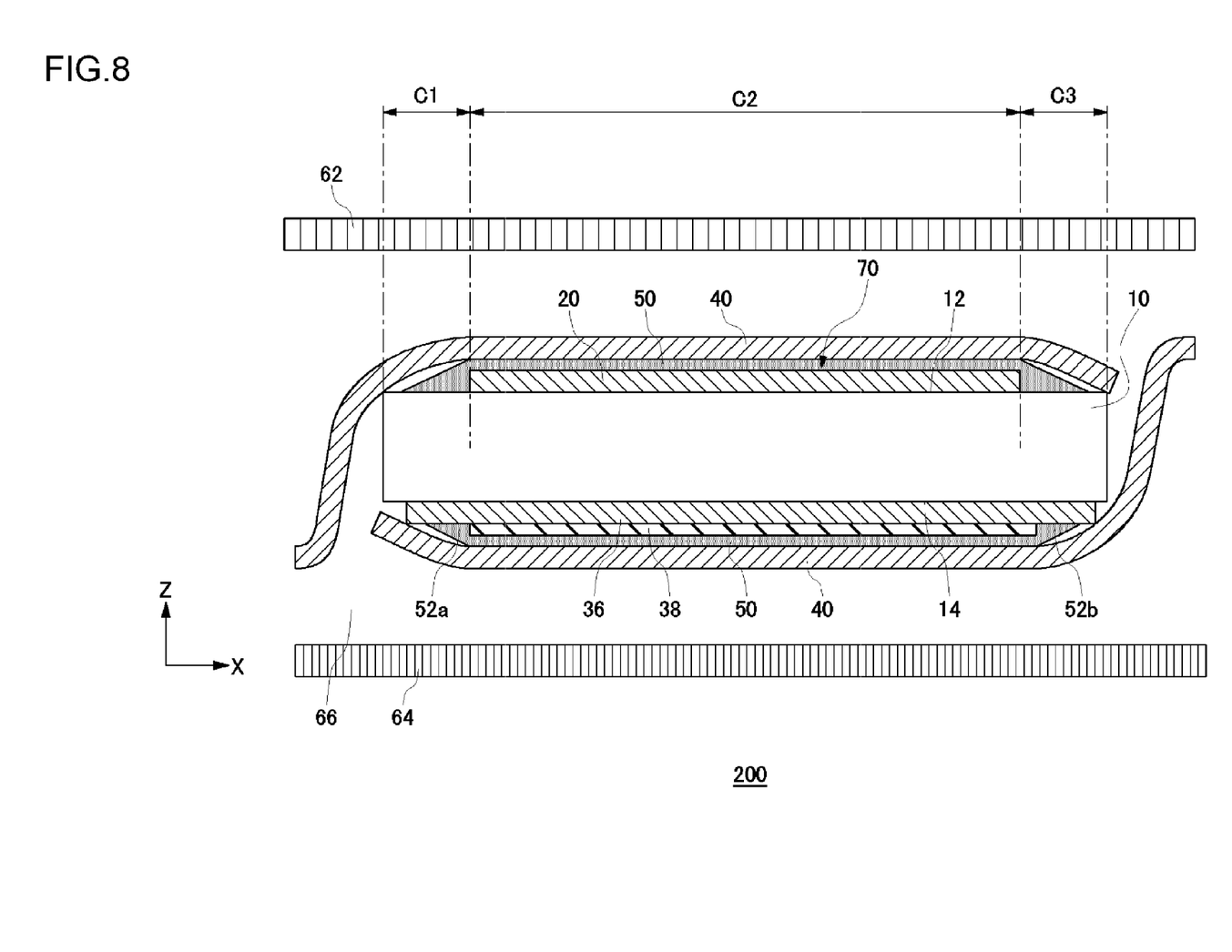
FIG. 8 is a cross-sectional view illustrating the solar cell module.
Figure 9:
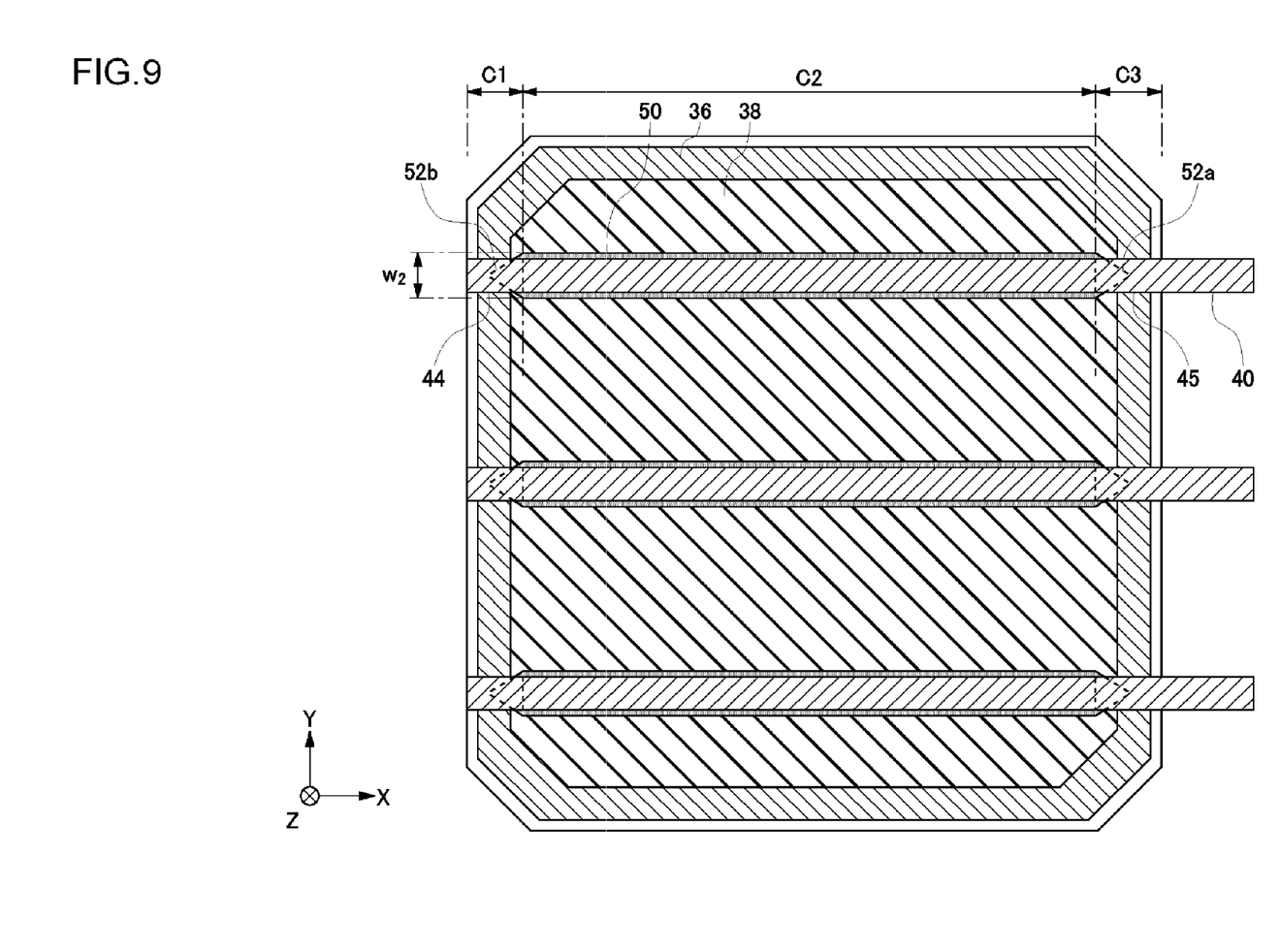
FIG. 9 is a plan view illustrating a back surface of the solar cell module.

FIG. 8 is a cross-sectional view illustrating the solar cell module 200 according to the second embodiment. FIG. 9 is a plan view illustrating the side of a back surface 14 of the solar cell module 200.

The solar cell module 200 according to the present embodiment has a structure that is the same as that according to the first embodiment. However, the solar cell module 200 is different in that the solar cell module 200 is provided with a copper electrode layer 36 and a tin electrode layer 38 that are formed on the substantially entire surface of the back surface 14. A connection member 40 that is provided on the side of the back surface 14 is bent in a direction in which a solar cell 70 is provided in the respective areas of end portions C1 and C3, and the connection member 40 and the copper electrode layer 36 are being directly in contact with each other. An explanation will be given in the following mainly regarding differences from the first embodiment.

The solar cell module 200 is provided with a plurality of solar cells 70, a connection member 40 connecting adjacent solar cells 70 with each other, a resin layer 50, a protection substrate 62, a back sheet 64, and a sealing layer 66.

The configuration of a solar cell 70 will be described first. The solar cell 70 is provided with an electricity generation layer 10, a first electrode 20, and a second electrode 30.

The second electrode 30 that is provided on the back surface 14 has a copper electrode layer 36 provided on the substantially entire surface on the back surface 14 and a tin electrode layer 38 that is provided on the copper electrode layer 36 and formed in such a manner that an electrode area thereof becomes smaller than that of the copper electrode layer 36. The tin electrode layer 38 is provided to prevent deterioration of the resin layer 50 due to diffusion of copper (Cu) included in the copper electrode layer 36 in the resin layer 50, which is caused by the copper electrode layer 36 and the resin layer 50 becoming directly in contact with each other.

The configuration of the resin layer 50 will be described in detail next.

The resin layer 50 is provided on the surface formed by the copper electrode layer 36 and the tin electrode layer 38 and bonds the connection member 40 on the surface such that the connection member 40 and the tin electrode layer 38 are directly in contact with each other and become electrically conductive. The resin layer 50 has a flat portion 51 and inclined portions 52a and 52b. The flat portion 51 is provided on the tin electrode layer 38 and extends in a narrow and long manner in an x direction. The inclined portion 52a and the inclined portion 52b are provided such that at least a portion of each of the inclined portions 52a and 52b is arranged on the copper electrode layer 36 and are provided to incline in such a manner that the thickness from the surface becomes thinner in a direction from the central portion toward the respective outer edge portions of the solar cell 70. The inclined portions 52a and 52b are formed such that the width $w_2$ thereof that is perpendicular to the longitudinal direction becomes narrower gradually in the direction from the central portion toward the respective outer edge portions of the solar cell 70.

The configuration of the connection member 40 will be described in detail next.

The connection member 40 is bonded by the resin layer 50 on the surface such that the connection member 40 is connected electrically and conductively to the first electrode 20 or the second electrode 30.

The connection member 40 is provided while being bent in a direction in which the solar cell 70 is provided in the respective areas of end portions C1 and C3. This allows the connection member 40 on the side of the back surface 14 to become directly in contact with the copper electrode layer 36. The copper electrode layer 36 has electrical conductivity that is higher compared to the tin electrode layer 38 including tin (Sn). Thus, the electricity collection efficiency of the connection member 40 can be increased by allowing the connection member 40 and the copper electrode layer 36 to become directly in contact with each other.

In order to provide the connection member 40 that is bent in the respective areas of the end portions C1 and C3, the protection substrate 62 and the back sheet 64 need to be preferably pressurized over the connection member 40 while a resin sheet that serves as the sealing layer 66 is being sandwiched, when the solar cell 70 is sealed. The connection member 40 is pressurized via the resin sheet, and the connection member 40 is bent in a direction in which the solar cell 70 is provided in the respective areas of end portions C1 and C3. This allows the solar cell 70 to be laminated while the connection member 40 is being bent, and the solar cell module 200 is thus formed.

An explanation will be given in the following regarding effects achieved by the solar cell module 200 according to the present embodiment.

In the solar cell module 200 according to the present embodiment, the inclined portions 52a and 52b are provided, as the resin layer 50 to which the connection member 40 is bonded, whose thickness becomes thinner gradually in a direction from the central portion toward the respective outer edge portions in the respective areas of the end portions C1 and C3. By providing the inclined portions 52a and 52b whose thickness becomes gradually thinner, the stress concentrating on the respective areas of the end portions C1 and C3 can be mitigated, thus preventing the connection member 40 from peeling off and the solar cell 70 from being damaged. Thus, the reliability of the solar cell module 200 can be increased.

In the solar cell module 200, the connection member 40 is provided while being bent such that the copper electrode layer 36 provided on the back surface 14 and the connection member 40 are directly in contact with each other. This allows the electricity collection efficiency of the connection member 40 to be increased and the electricity conversion efficiency of the solar cell module 200 to be thus improved.

Figure 10:
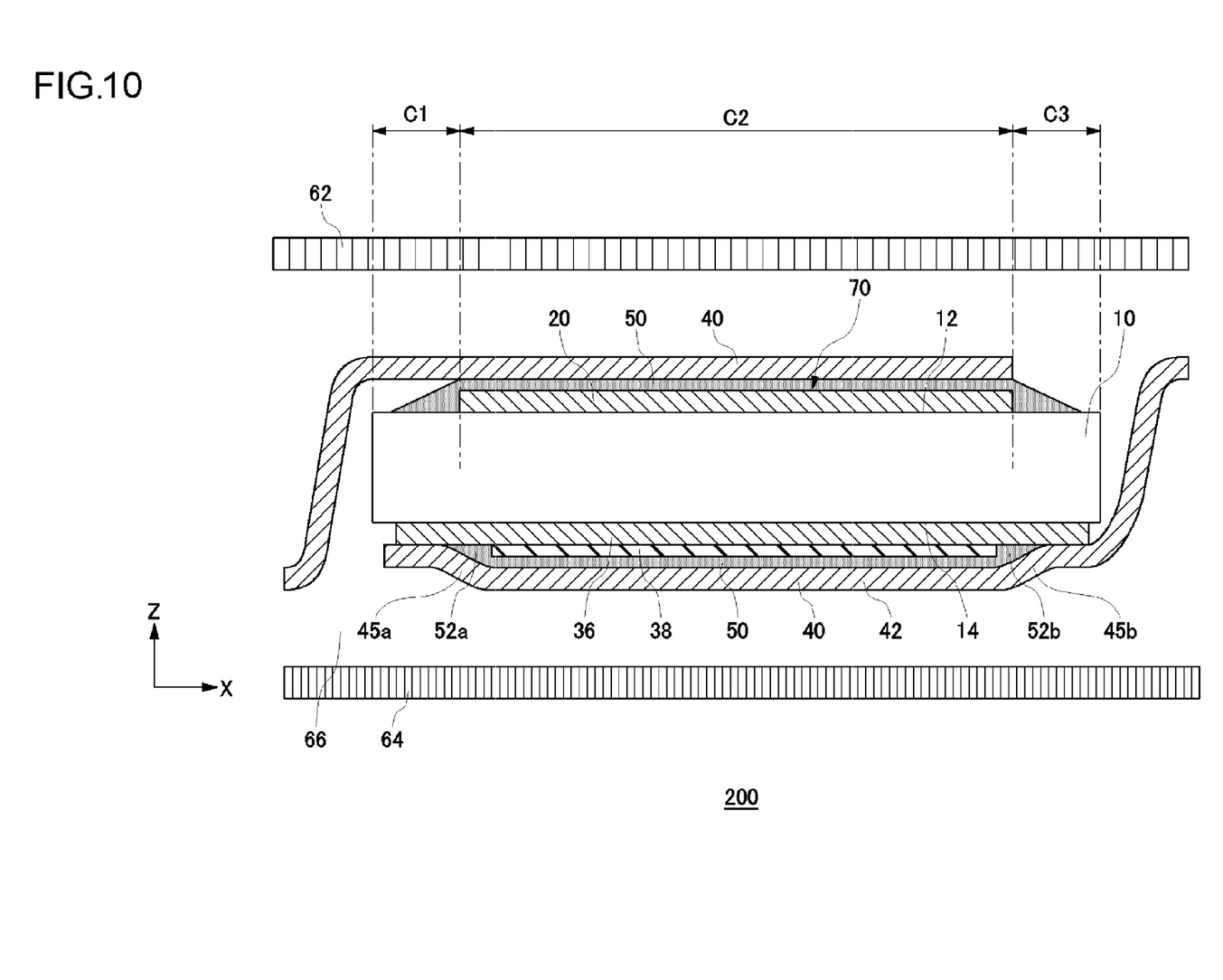
FIG. 10 is a cross-sectional view illustrating the solar cell module in an exemplary variation.

A solar cell module 200 according to an exemplary variation will be described in detail with reference to FIG. 10. FIG. 10 is a cross-sectional view illustrating the solar cell module 200 in the exemplary variation.

A connection member 40 according to the exemplary variation has step portions 45a and 45b that are bent in a direction in which a solar cell 70 is provided such that the connection member 40 is in contact with a copper electrode layer 36 in the respective areas of end portions C1 and C3 on a back surface 14. The step portions 45a and 45b are provided in accordance with the thickness of a tin electrode layer 38. This allows the connection member 40 to be bonded to the back surface 14 while being in contact with both the copper electrode layer 36 and the tin electrode layer 38 that have steps.

Since the connection member 40 and the copper electrode layer 36 become directly in contact with each other also in the exemplary variation, the electricity collection efficiency of the connection member 40 can be increased, and the electricity conversion efficiency of the solar cell module 200 can thus be improved. Also, the provision of the step portions 45a and 45b in the connection member 40 allows the connection member 40 and the copper electrode layer 36 to be in contact with each other in a more reliable manner. This allows the degree of electrical contact between the connection member 40 and the copper electrode layer 36 to be increased, and the reliability of the solar cell module 200 can thus be improved.

Described above is an explanation of the present invention based on the embodiments. These embodiments are intended to be illustrative only, and it will be obvious to those skilled in the art that various modifications to constituting elements and processes could be developed and that such modifications are also within the scope of the present invention.

In the above embodiments, inclined portions 52 are provided in both the respective areas of end portions C1 and C3. However, the inclined portions 52 may be provided in only one of the end portion areas.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

Priority is claimed to PCT International Patent Application Number PCT/JP2013/001165, filed on Feb. 27, 2013, the entire contents of which are hereby incorporated by reference.

What is claimed is:

1. A solar cell module manufacturing method comprising:
   preparing a solar cell, a connection member and an adhesive for bonding the solar cell with the connection member;
   applying the adhesive on a surface of the solar cell, in a shape of line, such that a height of the surface of the adhesive from the surface of the solar cell becomes lower gradually in a direction from the central portion of the solar cell toward an outer edge of the solar cell;
   arranging the connection member to overlap with the applied adhesive, such that a longitudinal direction of the connection member is aligned with a longitudinal direction of the applied adhesive; and
   hardening the adhesive by heating the connection member, thereby bonding the connection member and the adhesive,
   wherein after the hardening, a gap is formed between the connection member and the adhesive at a longitudinal edge of an area in which the adhesive is applied.

2. The solar cell module manufacturing method according to claim 1,
   wherein an amount of the adhesive that is applied at an outer edge portion of the solar cell is smaller than an amount of the adhesive applied at the central portion of the solar cell.

3. The solar cell module manufacturing method according to claim 1,
   wherein the solar cell comprises an electrode on a surface of the solar cell.

4. The solar cell module manufacturing method according to claim 1,
   wherein the solar cell and the connection member have a different thermal expansion coefficient with each other.

5. The solar cell module manufacturing method according to claim 4, wherein the solar cell comprises a crystalline silicon substrate, and the connection member which includes copper.

6. The solar cell module manufacturing method according to claim 1, wherein a width of the adhesive becomes narrower gradually in the direction from the central portion of the solar cell toward the outer edge of the solar cell in plan view.

7. The solar cell module manufacturing method according to claim 1, wherein the adhesive is a resin adhesive.

* * * * *